United States Patent
Kumagai et al.

(10) Patent No.: US 10,377,413 B2
(45) Date of Patent: Aug. 13, 2019

(54) ELECTRONIC CONTROL UNIT AND ELECTRIC POWER STEERING APPARATUS EQUIPPED WITH THE SAME

(71) Applicant: NSK LTD., Tokyo (JP)

(72) Inventors: Shin Kumagai, Tokyo (JP); Kyosho Uryu, Tokyo (JP); Nobuhiko Ando, Tokyo (JP)

(73) Assignee: NSK LTD., Tokyo (JP)

( * ) Notice: Subject to any disclaimer, the term of this patent is extended or adjusted under 35 U.S.C. 154(b) by 0 days.

(21) Appl. No.: 16/139,635

(22) Filed: Sep. 24, 2018

(65) Prior Publication Data
US 2019/0023317 A1 Jan. 24, 2019

Related U.S. Application Data

(62) Division of application No. 15/746,682, filed as application No. PCT/JP2016/073103 on Aug. 5, 2016, now Pat. No. 10,093,351.

(30) Foreign Application Priority Data

Aug. 19, 2015 (JP) .................. 2015-162093
Aug. 19, 2015 (JP) .................. 2015-162094

(51) Int. Cl.
*B62D 5/04* (2006.01)
*B62D 6/00* (2006.01)
(Continued)

(52) U.S. Cl.
CPC ............. *B62D 5/0484* (2013.01); *B62D 5/04* (2013.01); *B62D 5/046* (2013.01); *B62D 5/0487* (2013.01);
(Continued)

(58) Field of Classification Search
CPC .......... B62D 5/0484; B62D 6/00; B62D 5/04; B62D 5/046; B62D 5/0487; B62D 5/0463;
(Continued)

(56) References Cited

U.S. PATENT DOCUMENTS

| 6,798,161 B2 | 9/2004 | Suzuki |
| 8,829,710 B2 | 9/2014 | Takahashi et al. |
| 2016/0072421 A1 | 3/2016 | Sugawara |

FOREIGN PATENT DOCUMENTS

| JP | 08-149868 A | 6/1996 |
| JP | 10-094269 A | 4/1998 |

(Continued)

OTHER PUBLICATIONS

International Search Report for PCT/JP2016/073103 dated Nov. 8, 2016 [PCT/ISA/210].
(Continued)

*Primary Examiner* — Russell Frejd
(74) *Attorney, Agent, or Firm* — Sughrue Mion, PLLC

(57) ABSTRACT

An electronic control unit diagnoses a short failure of an inverter FETs and diagnoses whether the failure of the FET-short detecting section has occurred. The unit controls a motor through an inverter including a bridge having an upper-stage FETs and a lower-stage FETs via an MCU, having: an FET-short detecting section to detect a short failure of the upper-stage FETs and the lower-stage FETs based on respective connection point voltages of the upper-stage FETs and the lower-stage FETs; and a diagnostic function to detect a failure of the FET-short detecting section. The diagnostic function diagnoses the failure of the FET-short detecting section at start up and turns-OFF the upper-stage FETs and the lower-stage FETs when the failure is detected. The FET-short detecting section diagnoses the
(Continued)

short failure of the upper-stage FETs and the lower-stage FETs when the failure of the FET-short detecting section is not detected.

11 Claims, 14 Drawing Sheets

(51) Int. Cl.
| | |
|---|---|
| H02M 1/32 | (2007.01) |
| H02M 1/36 | (2007.01) |
| H02M 7/48 | (2007.01) |
| H02P 27/06 | (2006.01) |
| H02P 27/08 | (2006.01) |
| G01R 31/327 | (2006.01) |
| H02M 7/5387 | (2007.01) |
| H02P 29/024 | (2016.01) |
| H03K 17/082 | (2006.01) |

(52) U.S. Cl.
CPC ............ *B62D 6/00* (2013.01); *G01R 31/3275* (2013.01); *H02M 1/32* (2013.01); *H02M 1/36* (2013.01); *H02M 7/48* (2013.01); *H02M 7/53871* (2013.01); *H02P 27/06* (2013.01); *H02P 27/08* (2013.01); *H02P 29/0241* (2016.02); *H03K 17/0822* (2013.01); *B60Y 2400/3086* (2013.01); *B62D 5/0463* (2013.01)

(58) Field of Classification Search
CPC ............ G01R 31/3275; H03K 17/0822; H02P 29/024; H02P 27/08; H02P 27/06; H02M 7/48; H02M 1/32; H02M 1/36; H02M 7/53871; B60Y 2400/3086

See application file for complete search history.

(56) References Cited

FOREIGN PATENT DOCUMENTS

| | | |
|---|---|---|
| JP | 10-167085 A | 6/1998 |
| JP | 3860104 B1 | 12/2006 |
| JP | 2015-089292 A | 5/2015 |

OTHER PUBLICATIONS

Written Opinion for PCT/JP2016/073103 dated Nov. 8, 2016 [PCT/ISA/237].

PRIOR ART

PRIOR ART

PRIOR ART

ELECTRONIC CONTROL UNIT AND ELECTRIC POWER STEERING APPARATUS EQUIPPED WITH THE SAME

CROSS REFERENCE TO RELATED APPLICATIONS

This application is a divisional of U.S. application Ser. No. 15/746,682, filed Jan. 22, 2018, now U.S. Pat. No. 10,093,351, which is a National Stage of International Application No. PCT/JP2016/073103 filed Aug. 5, 2016, claiming priority based on Japanese Patent Application Nos. 2015-162093 filed Aug. 19, 2015 and 2015-162094 filed Aug. 19, 2015, the contents of all of which are incorporated herein by reference in their entirety.

TECHNICAL FIELD

The present invention relates to an electric power steering apparatus that driving-controls a motor by a micro controller unit (MCU) (a central processing unit (CPU), a micro processor unit (MPU), a microcomputer and the like) via an inverter which comprises a bridge having upper-stage (High side) field-effect transistors (FETs) and lower-stage (Low side) FETs, and in particular to an electronic control unit so that an overcurrent does not flow by surely detecting a short failure of the FETs. Further, the present invention relates to the high performance electronic control unit to suppress a dark current that a power supply of the inverter flows to a power supply of a control system, and to the electric power steering apparatus equipped with the above electronic control unit.

BACKGROUND ART

An electric power steering apparatus (EPS) which is equipped with an electronic control unit and provides a steering system of a vehicle with a steering assist torque (an assist torque) by means of a rotational torque of a motor, applies the steering assist torque to a steering shaft or a rack shaft by means of a transmission mechanism such as gears or a belt through a reduction mechanism. In order to accurately generate the assist torque, such a conventional electric power steering apparatus performs a feedback control of a motor current. The feedback control adjusts a voltage supplied to the motor so that a difference between a steering assist command value (a current command value) and a detected motor current value becomes small, and the adjustment of the voltage applied to the motor is generally performed by an adjustment of a duty of a pulse width modulation (PWM) control. The motor is driven by the inverter which is constructed with the FET bridges.

A general configuration of the conventional electric power steering apparatus will be described with reference to FIG. 1. As shown in FIG. 1, a column shaft (a steering shaft or a handle shaft) 2 connected to a handle (a steering wheel) 1 is connected to steered wheels 8L and 8R through reduction gears 3, universal joints 4a and 4b, a pinion-and-rack mechanism 5, and tie rods 6a and 6b, further via hub units 7a and 7b. In addition, the column shaft 2 is provided with a torque sensor 10 for detecting a steering torque Th of the steering wheel 1 and a steering angle sensor 14 for detecting a steering angle θ, and a motor 20 for assisting a steering force of the steering wheel 1 is connected to the column shaft 2 through the reduction gears 3. The electric power is supplied to a control unit (ECU) 30 for controlling the electric power steering apparatus from a battery 13 as a power supply, and an ignition key (IG) signal is inputted into the control unit 30 through an ignition key 11. The control unit 30 calculates a current command value of an assist control on the basis of the steering torque Th detected by the torque sensor 10 and a vehicle speed Vel detected by a vehicle speed sensor 12, and controls a current supplied to the motor 20 by means of a voltage control value Vref obtained by performing compensation or the like to the calculated current command value. The steering angle 6 can be obtained from a rotational sensor connected to the motor 20.

A controller area network (CAN) 40 to send/receive various information and signals on the vehicle is connected to the control unit 30, and it is also possible to receive the vehicle speed Vel from the CAN 40. Further, a Non-CAN 41 is also possible to connect to the control unit 30, and the Non-CAN 41 sends and receives a communication, analogue/digital signals, electric wave or the like except for the CAN 40.

In such an electric power steering apparatus, the control unit 30 mainly comprises a micro controller unit (MCU) (including a central processing unit (CPU), a micro processor unit (MPU), a microcomputer and the like), and general functions performed by programs within the MCU are, for example, shown in FIG. 2.

Functions and operations of the control unit 30 will be described with reference to FIG. 2. The steering torque Th from the torque sensor 10 and the vehicle speed Vel from the vehicle speed sensor 12 (or from the CAN 40) are inputted into a current command value calculating section 31. The current command value calculating section 31 calculates a current command value Iref1 based on the steering torque Th and the vehicle speed Vel using an assist map or the like. The calculated current command value Iref1 is added with a compensation signal CM for improving characteristics from a compensating section 34 at an adding section 32A. The current command value Iref2 after addition is limited of the maximum value thereof at a current limiting section 33. The current command value Irefm limited of the maximum value is inputted into a subtracting section 32B, whereat a detected motor current value Im is subtracted from the current command value Irefm.

The subtraction result I (=Irefm−Im) in the subtracting section 32B is proportional-integral-controlled (PI-controlled) at a PI-control section 35. The voltage control value Vref obtained by the PI-control at the PI-control section 35 and a modulation signal (a carrier) CF are inputted into a PWM-control section 36, whereat a duty thereof is calculated. The motor 20 is PWM-driven by an inverter 37 with a PWM signal calculated the duty. The motor current value Im of the motor 20 is detected by a motor current detection means 38 and is inputted into the subtracting section 32B for the feedback.

The compensating section 34 adds a self-aligning torque (SAT) detected or estimated and an inertia compensation value 342 at an adding section 344. The addition result is further added with a convergence control value 341 at an adding section 345. The addition result is inputted into the adding section 32A as the compensation signal CM, thereby to improve the control characteristics.

In a case that the motor 20 is a three-phase brushless motor, details of the PWM-control section 36 and the inverter 37 have a configuration as shown in FIG. 3, and the PWM-control section 36 comprises a duty calculating section 36A that calculates the duty signals D1 to D6 which are used in a three-phase PWM-control by using the voltage control command value Vref in accordance with a predetermined equation, and a gate driving section 36B that ON-drives or OFF-drives the FETs as a semiconductor switching device by means of the duty signals Dl to D6 and compensates a dead time. The modulation signal (the carrier) CF is inputted into the duty calculating section 36A, and the duty calculating section 36A calculates the duty signals Dl to D6 of the PWM by synchronized to the modulation signal CF.

The inverter 37 is configured to the three-phase bridges of the upper-stage FETs FET1 to FET3 and the lower-stage FETs FET4 to FET6. The motor 20 is driven by turning-ON or turning-OFF the FETs FET1 to FET6 by using the duty signals Dl to D6 of the PWM, respectively. The FETs FET1 to FET6 are the FET with a parasitic diode, respectively.

As well, a motor release switch 23 is interposed between the inverter 37 and the motor 20 in order to block a current supply for safety when the assist control is stopped and the like. The motor release switch 23 comprises the FETs with the parasitic diode disposed to the respective phases.

In such an inverter of the electric power steering apparatus, conventionally, in a case that the FETs FET1 to FET6 of the inverter 37 is a short failure, in order to prevent from that an overcurrent to the inverter 37 continuously flows, power supply relays (mechanical relays or semiconductor relays) 37B and 37C are disposed on power supply lines of a current detecting circuit 37A for detecting an inverter current of the inverter 37, the MCU and the inverter 37, as shown in FIG. 4. In an example shown in FIG. 4, although the inverter current is detected by a one-shunt type means, the inverter current may be detected by a two-shunt type means or a three-shunt type means.

The MCU diagnoses that the overcurrent f lows to the inverter 37, in a case of detecting such a short failure, blocks the overcurrent by turning-OFF the power supply relays 37B and 37C and insures the safety of the system. For example, Japanese Unexamined Patent Publication No. H10-167085 A (Patent Document 1) discloses a protection circuit with respect to the inverter of a two-phase motor. However, there is a problem that the power supply relay for blocking the overcurrent is expensive, and it is not especially adequate that the power supply relay is used to the electric power steering apparatus of the vehicle which a cost reduction is strongly required.

The List of Prior Art Documents

Patent Documents

Patent Document 1: Japanese Unexamined Patent Publication No. H10-167085 A
Patent Document 2: Japanese Patent No. 3860104 B2

SUMMARY OF THE INVENTION

Problems to be Solved by the Invention

In order to resolve the above problem, a product having a following function to block the overcurrent is commercially available (for example, "TLE7183F" manufactured from Infineon Technologies AG in Germany). That is, the above function is a function to block the overcurrent by monitoring respective voltages between a drain (D) and a source (S) of the upper-stage FETs and the lower-stage FETs of the inverter; by including an FET-short detecting circuit to detect the occurrence of the short failure, in spite of an OFF-driving of the FETs, due to that a voltage between the drain and the source of the FETs is low; and by turning-OFF the FETs of the inverter without the power supply relay.

However, in the above marketed product, since the circuit or the diagnostic function for diagnosing that the FET-short detecting circuit is normally worked is not provided, in a case that a no-detection failure being impossible detected at the FET-short detecting circuit is occurred, it is impossible to detect the no-detection failure. Thus, thereafter, when the FETs of the inverter continue the operations, there is a problem that the short failure cannot be detected and the overcurrent continues to flow through the inverter in a case that the short failure of the inverter FETs is occurred.

Further, in a case that the power supply relay for the overcurrent blocking is removed, the power supply of the inverter is always electrically conducted to the battery. For example, in order to monitor the power supply voltage of the inverter with the MCU, when the power supply voltage of the inverter is connected to the MCU via only a resistor voltage-dividing circuit in a conventional manner, there is a problem that the dark current due to the voltage-dividing resistor becomes large.

Furthermore, Japanese Patent No. 3860104 B2 (Patent Document 2) discloses the electric power steering apparatus that suppresses the dark current which flows to the ECU. In Patent Document 2, the power relay to supply or block the electric power is disposed between a motor operating control section and the power supply, and the power relay is turned-OFF after a gradual reduction process at a timing when the ignition key is turned-OFF. Therefore, there is a problem that a suppress effect of the dark current is not obtained until the ignition key is turned-OFF.

The present invention has been developed in view of the above-described circumstances, and an object of the present invention is to provide the electronic control unit, without an increase in cost, diagnoses the short failure of the inverter FETs by means of the FET-short detecting section, appropriately deals with the diagnosis result, has a function to diagnose whether the failure of the FET-short detecting section is occurred or not, and suppresses the dark current flowing through the control system regardless of the turning-OFF of the ignition key, and to provide the high-safety electric power steering apparatus equipped with the electronic control unit.

Means for Solving the Problems

The present invention relates to an electronic control unit that driving-controls a motor by means of an inverter which comprises a bridge having upper-stage field-effect transistors (FETs) and a lower-stage FETs via a micro controller unit (MCU), the above-described object of the present invention is achieved by that: comprising: an FET-short detecting section to detect a short failure of the upper-stage FETs and the lower-stage FETs based on respective connection point voltages of the upper-stage FETs and the lower-stage FETs; and a detecting-section-failure diagnostic function to detect a failure of the FET-short detecting section, wherein the detecting-section-failure diagnostic function diagnoses the failure of the FET-short detecting section at start up and turns-OFF the upper-stage FETs and the lower-stage FETs when the failure of the FET-short detecting section is detected, and wherein the FET-short detecting section diagnoses the short failure of the upper-stage FETs and the lower-stage FETs when the failure of the FET-short detecting section is not detected.

The above-described object of the present invention is efficiently achieved by that: wherein the respective connection point voltages are voltage-divided by a resistor voltage-dividing circuit and voltage-divided voltages are supplied to the FET-short detecting section; or wherein when the short failure is detected, FETs which at least the short failure is not detected are turned-OFF; or wherein the detecting-section-failure diagnostic function is incorporated in the MCU; or wherein when the FET-short detecting section detects the short failure in one of the upper-stage FETs and the lower-stage FETs, the FET-short detecting section notifies a short failure detection to the MCU via a notifying terminal; or wherein the FET-short detecting section detects the short failure based on a first threshold for the upper-stage FETs and a second threshold for the lower-stage FETs; or wherein the inverter is driven by means of duty signals of a pulse width modulation (PWM) which are calculated in the MCU, and the detecting-section-failure diagnostic function is a diagnostic function that outputs a gate-OFF signal to forcibly turn-OFF the inverter from the MCU at start up, forcibly establishes an abnormality condition of the short failure by calculating the duty signals of the upper-stage FETs or the duty signals of the lower-stage FETs, and outputs a predetermined signal to the notifying terminal; or wherein the notifying terminal is an NDIAG terminal (an error output terminal); or wherein the inverter is driven by means of the duty signals of PWM which are calculated in the MCU, and the detecting-section-failure diagnostic function has a diagnostic function that outputs a signal which forcibly transits an error notification of the FET-short detecting section from the MCU to an FET-short detecting state in order to confirm being capable of turning-OFF and stopping the inverter in a case that the FET-short detecting section detects the short failure, calculates with the duty signals of the upper-stage FETs or the duty signals of the lower-stage FETs, monitors upper and lower connection point voltages of the inverter, and diagnoses that a stop of the inverter is completed; or wherein a dark current suppressing switch is further interposed between control system circuits, the MCU switches-ON the dark current suppressing switch at start up, the detecting-section-failure diagnostic function turns-OFF the upper-stage FETs and the lower-stage FETs when the short failure is detected, and the MCU switches-OFF the dark current suppressing switch when an operation of the MCU is stopped; or wherein the respective connection point voltages are voltage-divided by a resistor voltage-dividing circuit and voltage-divided voltages are supplied to the FET-short detecting section; or wherein the dark current suppressing switch is a transistor including an FET, and a parasitic diode is connected in parallel with the transistor for a reverse connection protection; or wherein the control system circuits include at least the MCU, the resistor voltage-dividing circuit and the FET-short detecting section.

The above-described object of the electric power steering apparatus is achieved by being equipped with the electronic control unit, and being applied the electronic control unit to a motor for assist-controlling a vehicle.

Effects of the Invention

According to the present invention, since the electric power steering apparatus comprises the FET driving circuit including the gate driving section to turn-ON or turn-OFF the upper-stage FETs and the lower-stage FETs of the inverter and drive them, the FET-short detecting section to detect the short failure of the upper-stage FETs and the lower-stage FETs of the inverter based on the connection point voltages of the upper-stage FETs and the lower-stage FETs, and the detecting-section-failure diagnostic function to diagnose the failure (including the abnormality) of the FET-short detecting section, detects the short failure of the upper-stage FETs and the lower-stage FETs of the inverter, and diagnoses the failure of the FET-short detecting section, it is possible to provide the high safety electric power steering apparatus. In addition, it is possible to remove the expensive power supply relay or the switch which is disposed on a power supply line of the inverter for blocking the overcurrent which is generated in an occurrence time of the FET-short failure of the inverter.

Further, since the dark current suppressing switch is switched-ON at start up and is switched-OFF when the FET-short failure is detected, the dark current suppressing switch is switched-ON during only the operating time of the ECU regardless of the turning-OFF of the ignition key. Consequently, it is possible to suppress an inflow of the dark current to the control system.

Furthermore, it is possible to confirm that the FET-short detecting section correctly works by using the detecting-section-failure diagnostic function of an inside of the MCU or an external. In this connection, it is impossible to detect the occurrence of the no-detection failure of the FET-short detecting section corresponding to the first failure by turning-OFF the inverter FETs when the failure of the FET-short detecting section is occurred, and thereafter it is possible to prevent, by continuing the current flowing, that the overcurrent continues flowing through the FETs when the short failure of the inverter corresponding to the second failure is occurred. Therefore, the safety of the electric power steering apparatus can be maintained.

MODE FOR CARRYING OUT THE INVENTION

Figure 1:
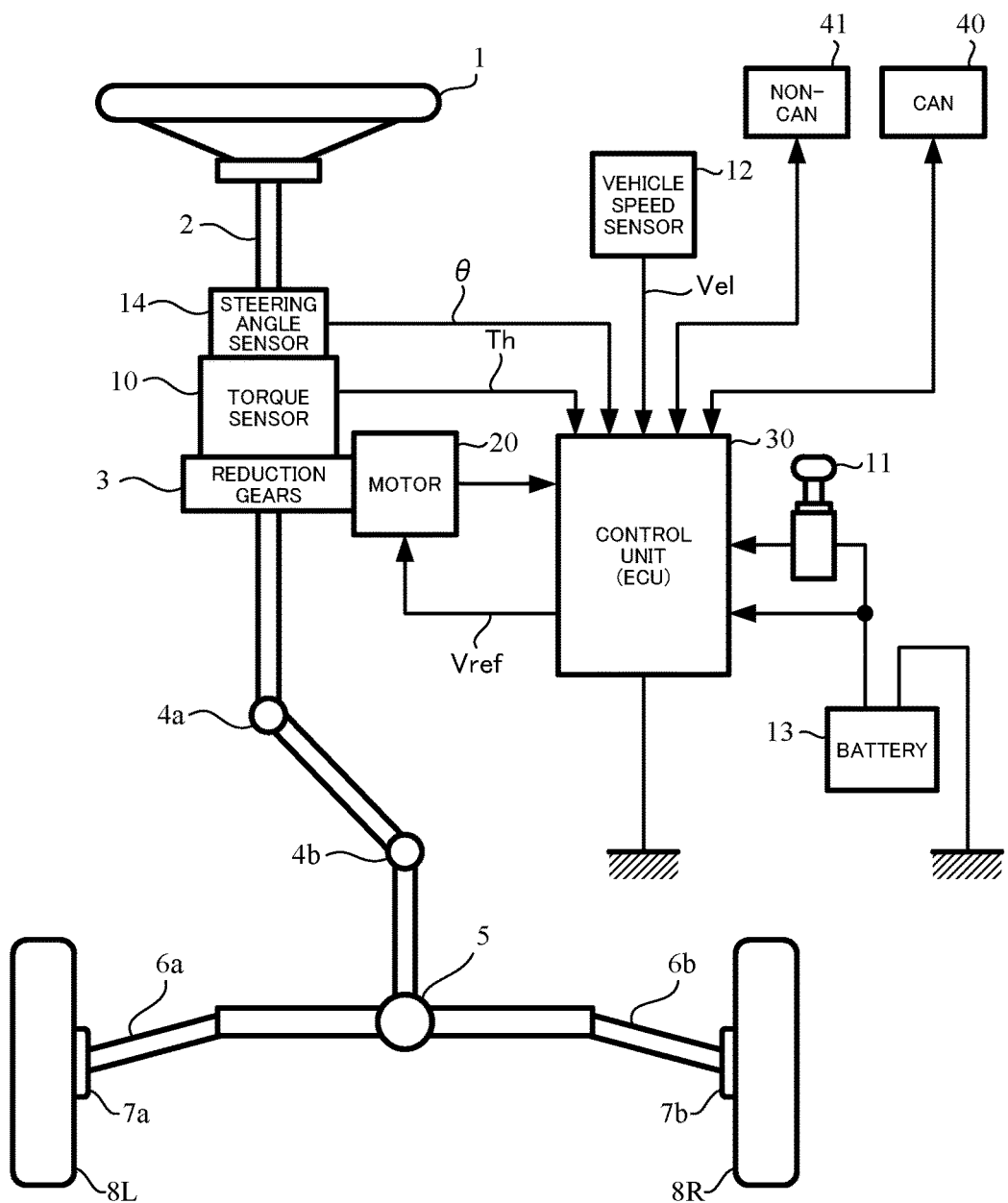
FIG. 1 is a configuration diagram showing a general outline of an electric power steering apparatus.
Figure 2:
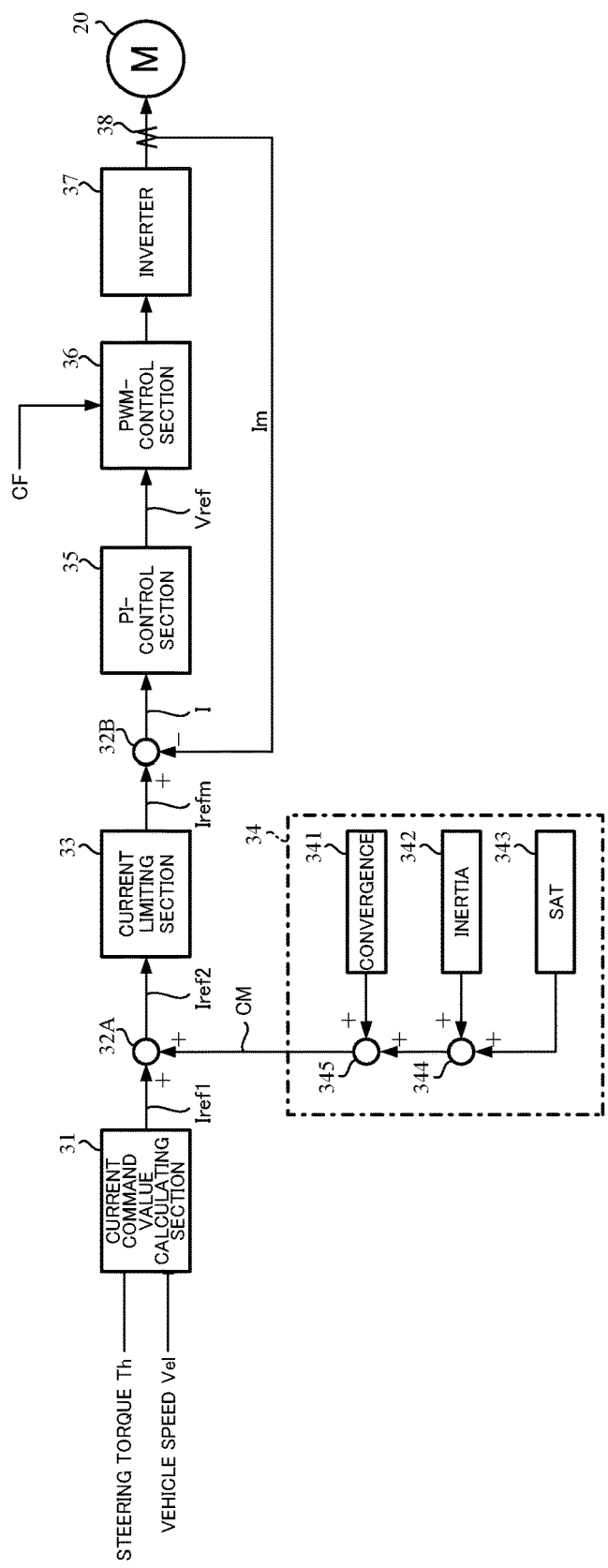
FIG. 2 is a block diagram showing a configuration example of a control system of an electric power steering apparatus.
Figure 3:
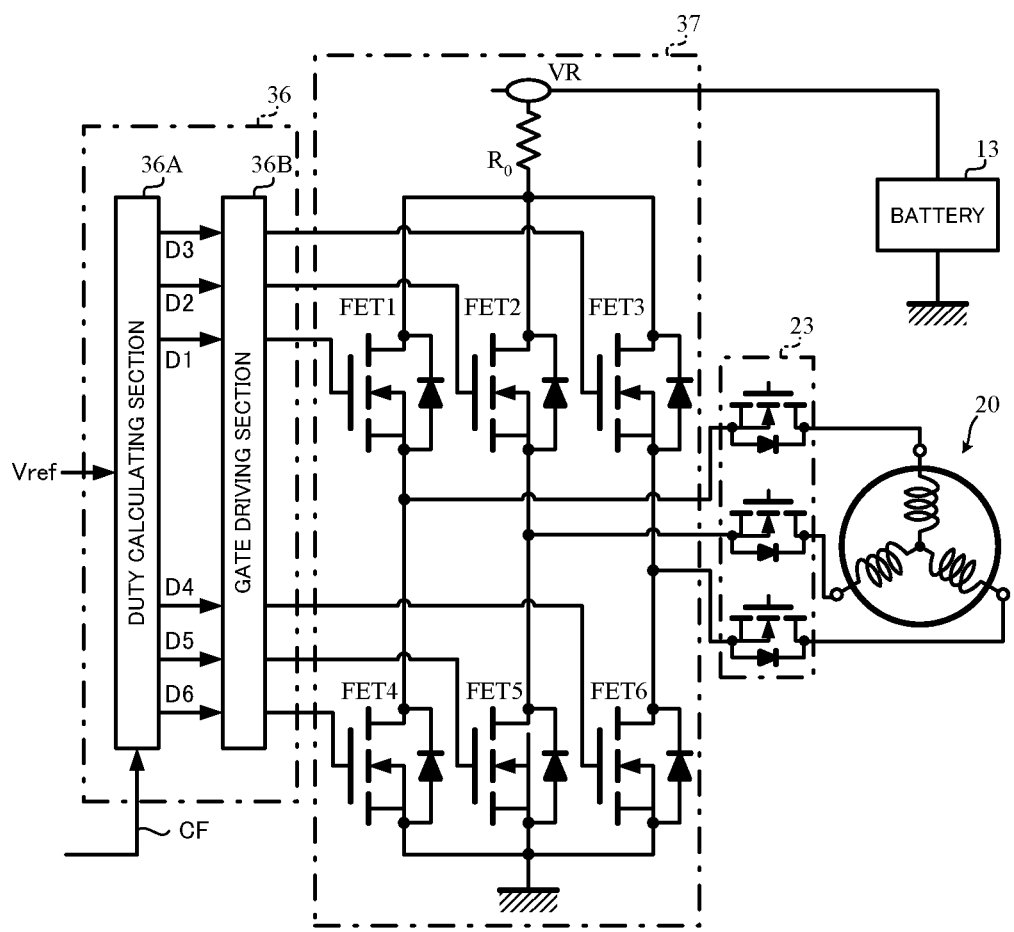
FIG. 3 is a circuit diagram showing a general configuration example of a PWM-control section and an inverter.
Figure 4:
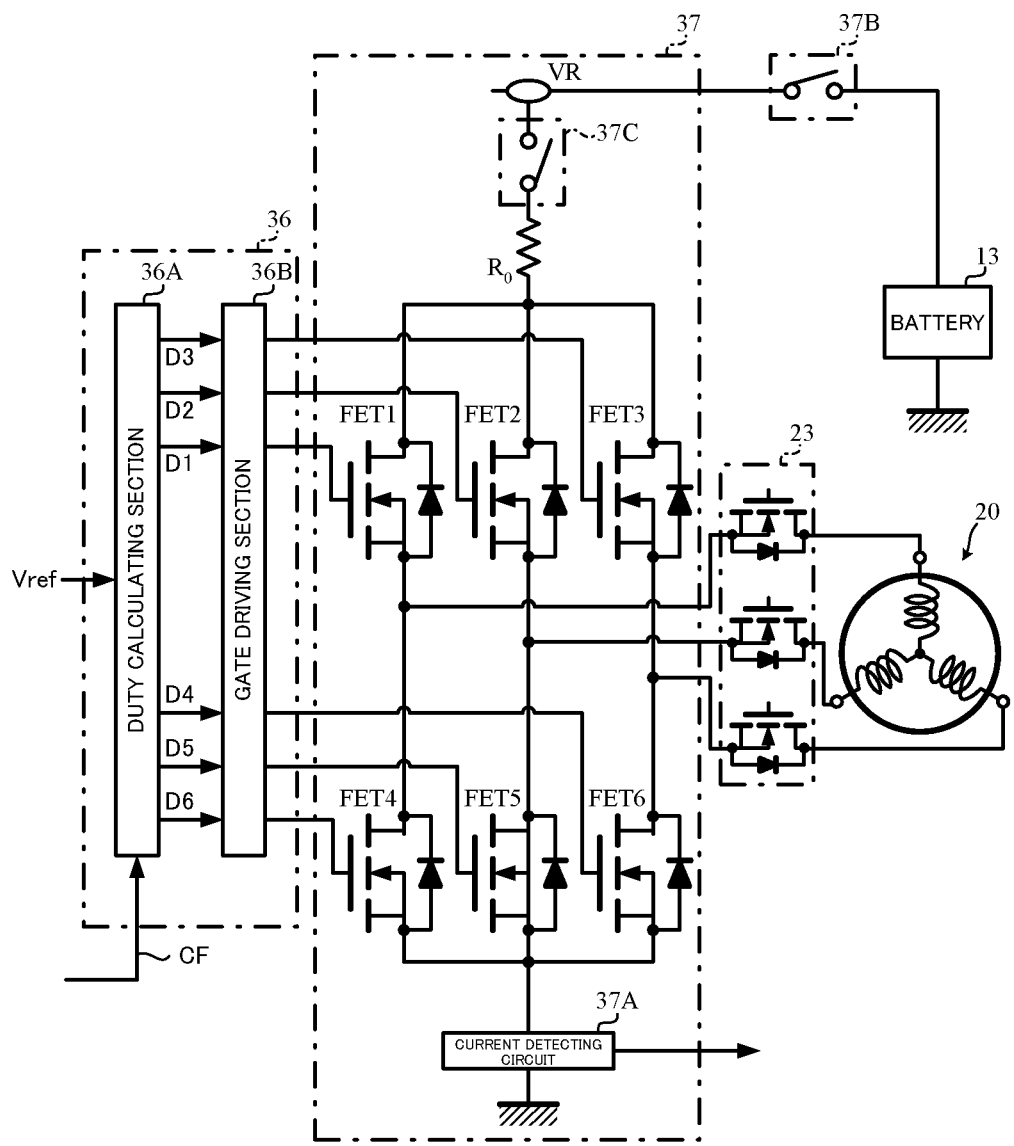
FIG. 4 is a circuit diagram showing a configuration example of the inverter that has a conventional protection function.

The present invention is an electronic control unit that driving-controls a motor, especially an assist control motor for a vehicle, by means of an MCU (a CPU, an MPU, a microcomputer and the like) via an inverter which comprises an FET bridge having upper-stage FETs (High side) and lower-stage FETs (Low side)) as semiconductor switching devices. The electronic control unit according to the present invention comprises an FET driving circuit that includes a gate driving section to turn-ON or turn-OFF and drive the FETs of the inverter, an FET-short detecting section to detect a short failure of the upper-stage FETs and the lower-stage FETs of the inverter based on the respective connection point voltages of the upper-stage FETs and the lower-stage FETs, and a detecting-section-failure diagnostic function that is incorporated in an inside of the MCU or an external of the MCU in order to diagnose the failure (including an abnormality) of the FET-short detecting section. The FET-short detecting section detects the FET-short failure occurred at one of the upper stage and the lower stage of the inverter, the upper-stage FETs and the lower-stage FETs (at least the FETs that the short failure is not detected) are turned-OFF when the FET-short failure is detected.

At start up time of the electric power steering apparatus, the detecting-section-failure diagnostic function in the MCU diagnoses the failure of the FET-short detecting section, the gate driving section turns-OFF the FETs of the inverter, that is, an operation of the inverter is stopped when the failure of the FET-short detecting section is detected. Or, at start up time of the electric power steering apparatus, a dark current suppressing switch is switched-ON and the detecting-section-failure diagnostic function in the MCU diagnoses the failure of the FET-short detecting section, the FETs of the inverter are turned-OFF by the gate driving section and the dark current suppressing switch is switched-OFF when the failure of the FET-short detecting section is detected.

In addition, in the present invention, it is possible to confirm that the FET-short detecting section correctly works by using the detecting-section-failure diagnostic function of an inside of the MCU or an external, and the inverter FETs are immediately turned-OFF when the failure of the FET-short detecting section is detected. Thus, it is impossible to detect the occurrence of the no-detection failure of the FET-short detecting section corresponding to the first failure by turning-OFF the inverter FETs when the failure of the FET-short detecting section is occurred, and thereafter it is possible to prevent, by continuing the current flowing, that the overcurrent continues flowing through the FETs when the short failure of the inverter corresponding to the second failure is occurred and to maintain the safety of the electric power steering apparatus. By using the FET-short detecting section secured the safety as described above, it is possible to remove the expensive power supply relay or the switch which is disposed on a power supply line of the inverter for blocking the overcurrent which is generated in an occurrence time of the FET-short failure of the inverter. Therefore, it is possible to effectively achieve the miniaturization and the cost down.

Embodiments according to the present invention will be described with reference to the drawings. An example which is applied the electronic control unit of the present invention to the electric power steering apparatus will be described as the embodiments.

Figure 5:
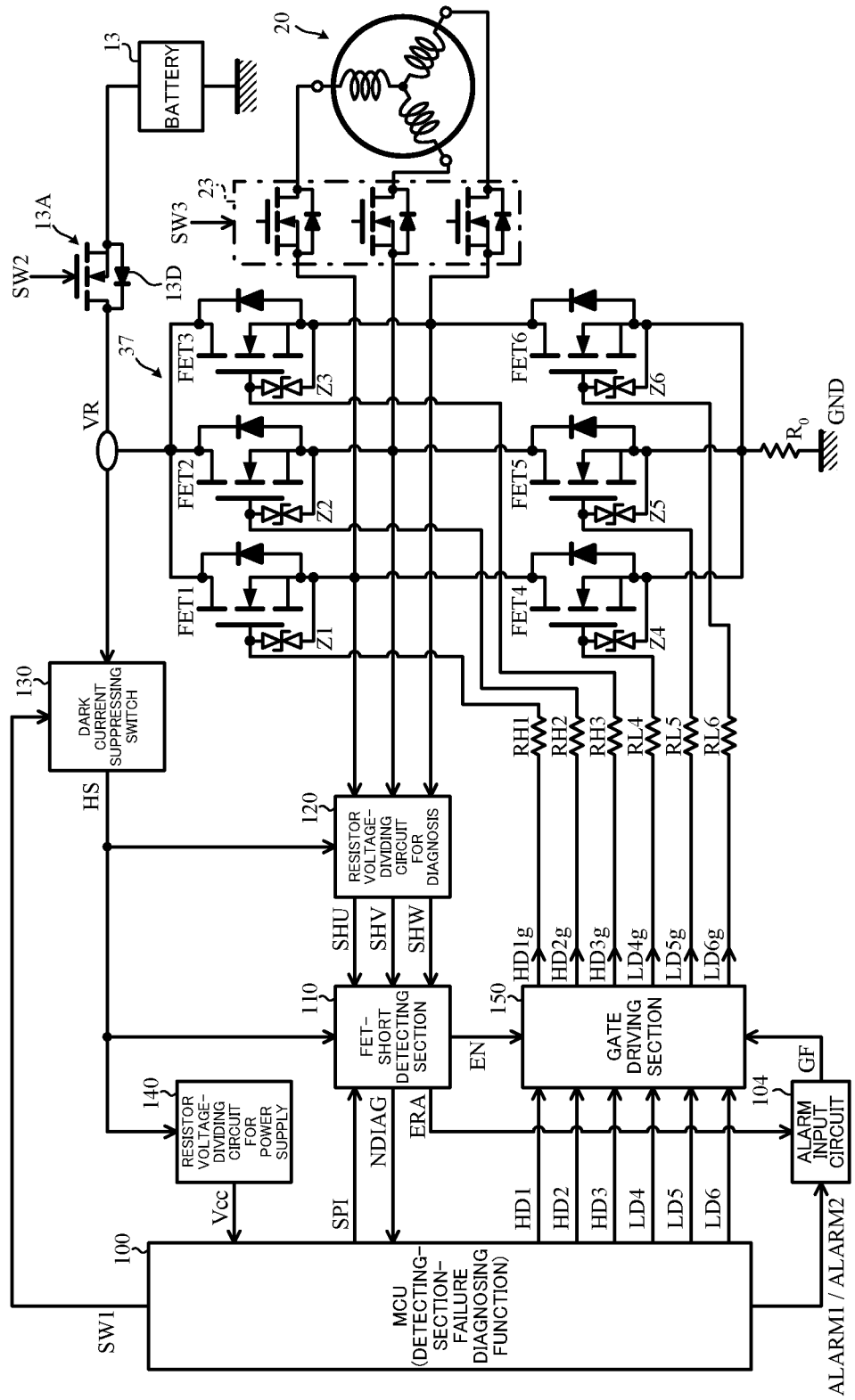
FIG. 5 is a block diagram showing a configuration example of the present invention.

As shown in FIG. 5, the electronic control unit according to the present invention comprises an MCU 100 to perform an overall control, an FET 13A for a reverse connection protection that is interposed between a battery 13 and a power supply VR and is switched-ON or switched-OFF based on a switching signal SW2 from the MCU 100, a gate driving section 150 to form an FET driving circuit which drives FETs FET1 to FET6 of an inverter 37 by duty signals HD1 to HD3 (the upper-stage (High side) FETs) and LD4 to LD6 (the lower-stage (Low side) FETs) which are calculated in the MCU 100, a resistor voltage-dividing circuit for diagnosis 120 that voltage-divides connection point (middle point) voltages of the inverter 37 (sources (S) of the upper-stage FETs and drains (D) of the lower-stage FETs) with a resistor circuit, an FET-short detecting section 110 to detect an FET-short failure of the inverter 37 via the resistor voltage-dividing circuit for diagnosis 120, a dark current suppressing switch 130 that is connected to the power supply VR and is switched-ON or switched-OFF with a switching signal SW1 from the MCU 100, and a resistor voltage-dividing circuit for power supply 140 that shifts a level coincident with an input voltage range of the MCU 100 in order to detect a voltage HS from the dark current suppressing switch 130.

The FET 13A is the FET for the reverse connection protection, and prevents from a short failure with a parasitic diode 13D of the inverter FET at a time of the reverse connection. The present invention removes the power supply relay that blocks the power supply VR by using the FET-short detecting function, and deals with the short failure with only the FET 13A for the reverse connection protection. As a trade-off, since the dark current flows via the parasitic diode 13D of the FET 13A for the reverse connection protection, the dark current suppressing switch 130 is provided as the above countermeasure. The voltage HS from the dark current suppressing switch 130 is supplied to the resistor voltage-dividing circuit for diagnosis 120, the FET-short detecting section 110 and the resistor voltage-dividing circuit for power supply 140. Zener diodes Z1 to Z6 for absorbing an overvoltage are connected between the gates and the sources of the FETs FET1 to FET6 of the inverter 37, respectively.

Figure 6:
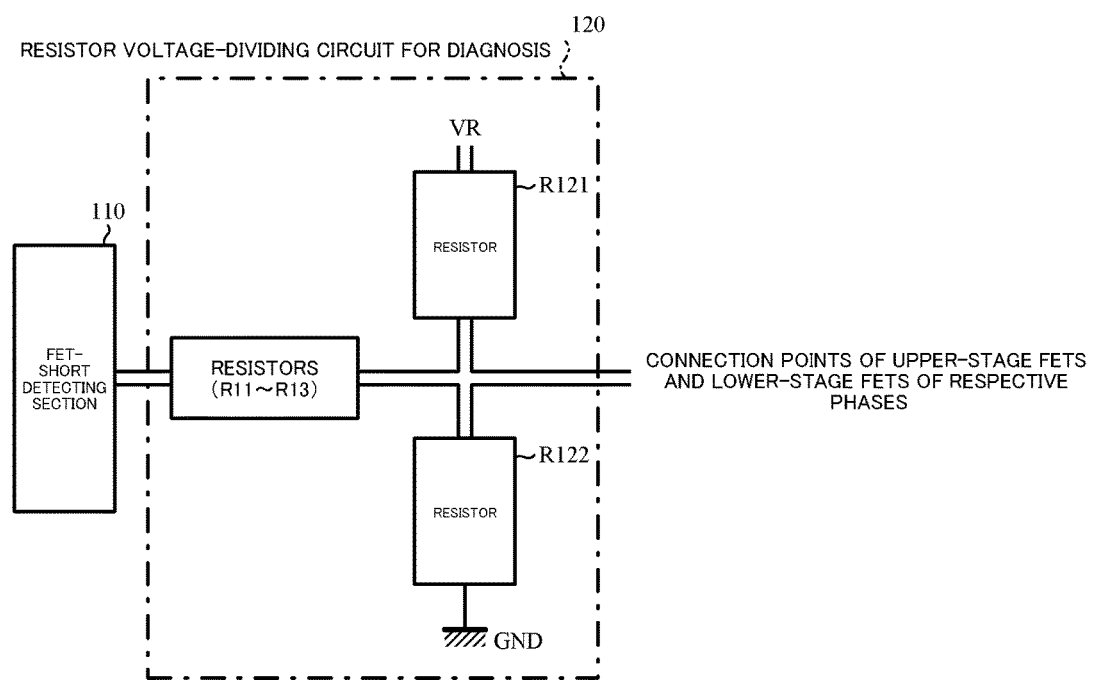
FIG. 6 is a block diagram showing a detail of a resistor voltage-dividing circuit for diagnosis.

A detail of the resistor voltage-dividing circuit for diagnosis 120 is a configuration (three-phase) as shown in FIG. 6. Connection point voltages of the upper-stage FETs and the lower-stage FETs are voltage-divided by resistors R121 and R122, which are interposed between the power supply (VR) and the ground (GND), and voltage-divided voltages are supplied to the FET-short detecting section 110 via resistors R11 to R13 with three-phase. When the upper-stage FETs and the lower-stage FETs are turned-OFF, the connection point voltages of the upper-stage FETs and the lower-stage FETs are voltage-divided into "½×VR", and voltage-divided voltages SHU (U-phase), SHV (V-phase) and SHW (W-phase) of the respective phases are outputted.

The FET-short detecting section 110 detects the short failure of the upper-stage FETs and the lower-stage FETs of the inverter 37 based on the voltage-divided voltages SHU, SHV and SHW which are obtained at the voltage-dividing circuit for diagnosis 120, detects whether the short failure occurs at the upper-stage FETs or the lower-stage FETs of the inverter 37 and outputs an error notification EN when the short failure of the FETs is detected. The error notification EN is inputted into the gate driving section 150, and the gate driving section 150 makes the outputs HD1g to LD6g set an "L" signal, and turns-OFF the FETs FET1 to FET6 of the inverter 37. The FET-short detecting section 110 notifies the detection of the short failure to the MCU 100 via an NDIAG terminal of a notification terminal, transmits an error signal ERA to an alarm input circuit 104, outputs a gate-OFF command GF via the alarm input circuit 104 and stops the operation of the inverter 37 via the gate driving section 150 based on the gate-OFF command GF.

The MCU 100 has the detecting-section-failure diagnostic function for diagnosing the failure of the FET-short detecting section 110. When the MCU 100 detects the failure of the FET-short detecting section 110 in the diagnosis, the MCU 100 outputs the gate-OFF command GF via the alarm input circuit 104 and stops the operation of the inverter 37 via the gate driving section 150 based on the gate-OFF command GF. Or, the MCU 100 does not use the alarm input circuit 104, outputs the gate-OFF command GF with the duty signals HD1 to HD3 and LD4 to LD6 to the gate driving section 150, and may stop the working of the inverter 37.

Figure 7:
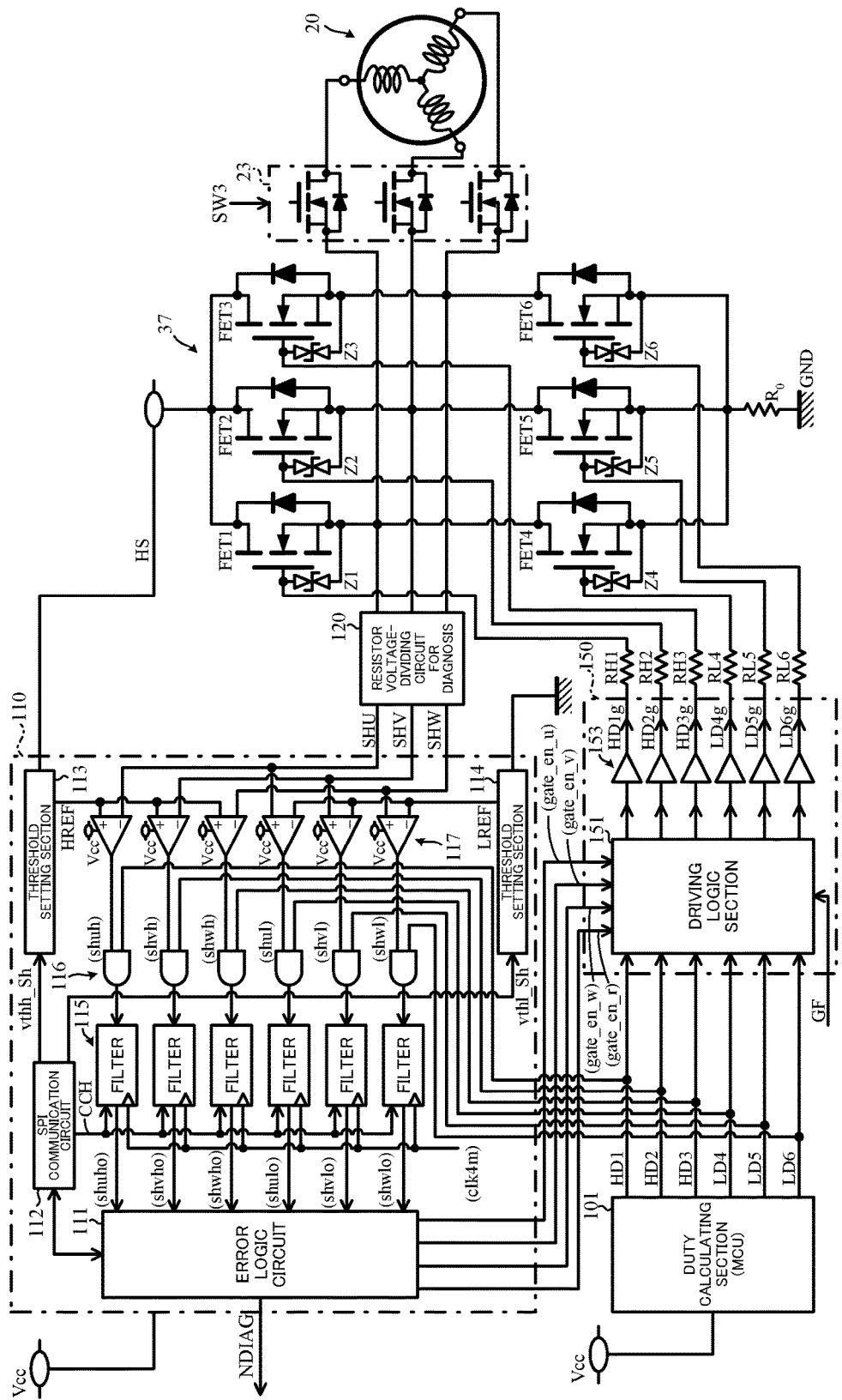
FIG. 7 is a circuit diagram showing a detail of a portion of a configuration example (an FET-short detecting section) of the present invention (the first embodiment)

FIG. 7 shows a detail configuration example of the FET-short detecting section 110 and the gate driving section 150, and the voltage-divided voltages SHU, SHV and SHW from the resistor voltage-dividing circuit for diagnosis 120 are inputted into negative terminal inputs (−) of upper stage-side (H-side) comparators (three comparators) 117 and are inputted into positive terminal inputs (+) of lower stage-side (L-side) comparators (three comparators) 117 in the FET-short detecting section 110. The FET-short detecting section 110 includes a serial peripheral interface (SPI) communication circuit 112, and the SPI communication circuit 112 transmits an H-side setting signal vthh_Sh and an L-side setting signal vthl_Sh to threshold setting sections 113 and 114, respectively. The voltage HS is supplied to the threshold setting section 113, and the threshold setting section 114 is grounded. The threshold setting sections 113 and 114 set thresholds HREF and LREF based on the setting signals vthh_Sh and vthl_Sh, respectively, and the threshold HREF is "HS−vthh_Sh" and the threshold LREF is "vthl_Sh". The threshold HREF is inputted into positive terminal inputs (+) of the H-side comparators 117, and the threshold LREF is inputted into negative terminal inputs (−) of the L-side comparators 117. The comparators 117 respectively compare the connection point (voltage-divided) voltages SHU, SHV and SHW with the thresholds HREF and LREF in accordance with a following Table 1, and comparator outputs shuh, shvh, shwh, shul, shvl and shwl which have a binary value ("H" or "L") are outputted.

TABLE 1

| comparator input | comparator output | input signal | abnormality state |
|---|---|---|---|
| SHU > LREF | shul = H | LD4 = H | external FET short of HD1g |
| SHV > LREF | shvl = H | LD5 = H | external FET short of HD2g |
| SHW > LREF | shwl = H | LD6 = H | external FET short of HD3g |
| SHU < HREF | shuh = H | HD1 = H | external FET short of LD4g |
| SHV < HREF | shvh = H | HD2 = H | external FET short of LD5g |
| SHW < HREF | shwh = H | HD3 = H | external FET short of LD6g |

Here, HREF = HS − vthh_Sh (H-side detection threshold) and LREF = vthl_Sh (L-side detection threshold).

That is, the upper-stage comparators corresponding to the upper-stage FETs FET1 to FET3 satisfy a below Equation 1, and the lower-stage comparators corresponding to the lower-stage FETs FET4 to FET6 satisfy a below Equation 2.

$shuh=H$ when $SHU<HREF$, and $shuh=L$ when $SHU>HREF$ $shvh=H$ when $SHV<HREF$, and $shvh=L$ when $SHV>HREF$ $shwh=H$ when $SHW<HREF$, and $shwh=L$ when $SHW>HREF$ [Equation 1]

$shul=H$ when $SHU>LREF$, and $shul=L$ when $SHU<-LREF$ $shvl=H$ when $SHV>LREF$, and $shvl=L$ when $SHV<-LREF$ $shwl=H$ when $SHW>LREF$, and $shwl=L$ when $SHW<-LREF$ [Equation 2]

In the above Table 1, "LD4" denotes an input signal (a duty signal) from the MCU 100 (a duty calculating section 101) for driving the lower-stage FET4 of the U-phase, "LD5" does an input signal (a duty signal) from the MCU 100 for driving the lower-stage FET5 of the V-phase, "LD6" does an input signal (a duty signal) from the MCU 100 for driving the lower-stage FET6 of the W-phase, "HD1" does an input signal (a duty signal) from the MCU 100 for driving the upper-stage FET1 of the U-phase, "HD2" does an input signal (a duty signal) from the MCU 100 for driving the upper-stage FET2 of the V-phase and "HD3" does an input signal (a duty signal) from the MCU for driving the upper-stage FET3 of the W-phase. These duty signals LD4 to HD3 are respectively inputted into corresponding AND-circuits 116.

Comparison results shuh to shwl from the six comparators 117 and the duty signals LD4 to HD3 are inputted into six AND-circuits 116, and the respective outputs of the AND-circuits are inputted into six filters 115. The respective filters 115 are digital filters for judging whether for example, a 10 [μs]-continuation is satisfied or not, and an inputting clk4$m$ is a clock signal for counting a time 10 [μs]. A setting changing signal CCH for changing a count time is inputted into the filters 115 from the SPI communication circuit 112. As well, the SPI communication circuit 112 is an interface with the MCU 100, and is able to change the filtering time and is in a pseudo able to set an internal value of error logic to an error state.

The respective outputs shuho, shvho, shwho, shulo, shvlo and shwlo of the filters 115 are inputted into an error logic circuit 111, and the error logic circuit 111 outputs the error notifications EN (gate_en_u, gate_en_v, gate_en_w and gate_en_r) and notifies the error to the MCU 100 via the NDIAG terminal. The error logic circuit 111 is a circuit which turns-OFF the output of the NDIAG and the upper-stage FETs FET1 to FET3 and the lower-stage FETs FET3 to FET 6 based on an abnormality judging result of the FET-short detection, and enables to change the internal value from the SPI communication circuit 112 in order to judge the failure of the FET-short detection.

Figure 8:
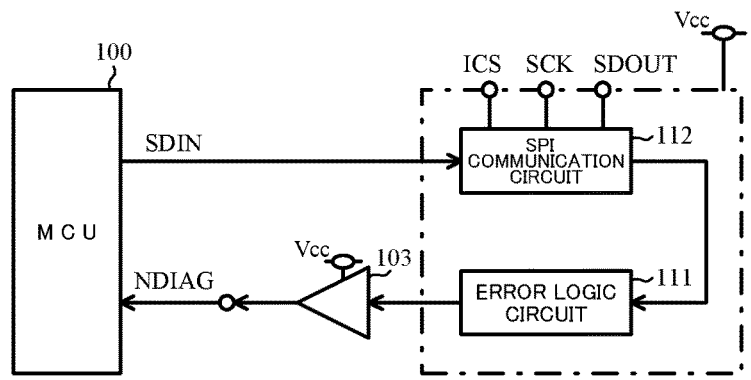
FIG. 8 is a block diagram showing a configuration example of an NDIAG terminal.

As shown in FIG. 8, an operation check of the NDIAG terminal can be performed by setting a register diag_dg="1", which comprises the SPI communication circuit 112 and the error logic circuit 111, by using the SPI communication of the MCU 100, and then by checking whether the NDIAG function is normally operated or not. Besides, the registers are various memories in the error logic circuit 111, and indicate status information and configuration information of an integrated circuit (IC).

That is, when setting the register diag_dg="1" or "0" by using the SPI communication, in a case of the register diag_dg="0", the NDIAG="H" is obtained by a denying section (NOT) 103, and in a case of the register diag_dg="1", the NDIAG="L" is obtained by the denying section 103. It is possible to confirm whether the NDIAG operates normally or not by performing a comparison of expectation values of the NDIAG due to the MCU 100. The NDIAG="H" is obtained by setting again the register diag_dg="0", and the normal abnormality detecting function becomes available.

Figure 9:
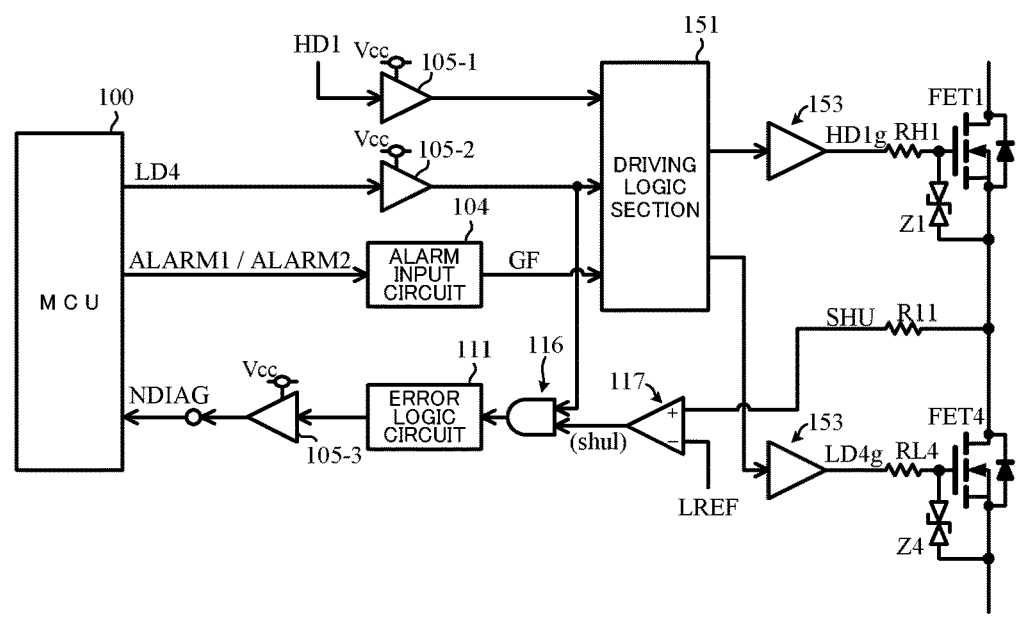
FIG. 9 is a block diagram showing a detail of the FET-short detecting section (U-phase)

Next, the FET-short-detection operation check will be described by showing the configuration of the U-phase in FIG. 9 and FIG. 10. FIG. 9 shows the FET-short detection and FIG. 10 does a confirmation configuration that the FET driving is "OFF" at the time of the short detection.

In FIG. 9, it is possible to confirm whether the short detecting functions of the respective FETs FET1 to FET6 work normally or not by that the MCU 100 sets ALARM1 or ALARM2. That is, the ALARM1="L" or the ALARM2="L" is inputted into an alarm input circuit 104, and the gate-OFF command GF, which is an input of the driving logic section 151, is set to "H". Since the output HD1g of the driving logic section 151 is "L" by setting the ALARM1="L" or the ALARM2="L", the voltage-divided voltage SHU is the middle voltage between the power supply (VR) and the ground (GND) and then the output shul of the comparator 117 is "H". Since the duty signal LD4 from the MCU 100 is "H" and the output shul of the comparator 117 is "H", the output (a register scul) of the AND-circuit 116 is "H", the state becomes to the short detecting state, and the NDIAG becomes to "L". Accordingly, it is possible to diagnose whether the short detecting function works normally or not by monitoring the NDIAG. The NDIAG becomes to "H" by clearing the register (scul) in the error logic circuit 111 by means of the SPI communication.

Figure 10:
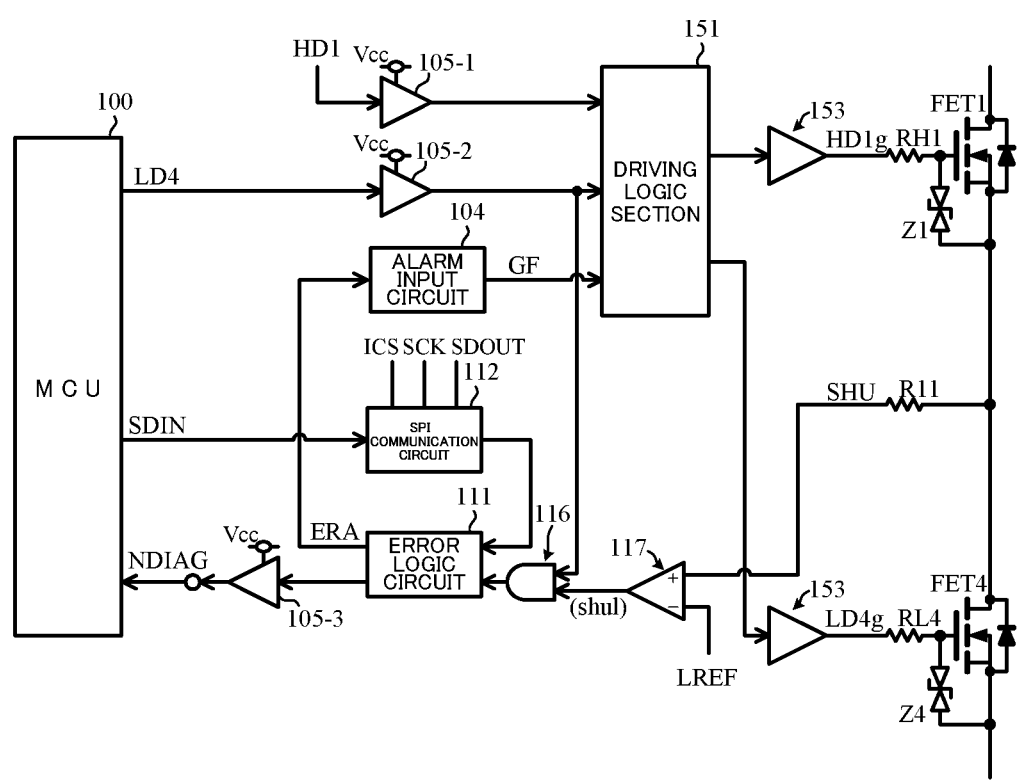
FIG. 10 is a block diagram showing a detail of the FET-short detecting section (U-phase)

FIG. 10 shows the confirmation configuration that the FET driving is "OFF" at the time of the short detection. By setting respective phase registers shuh_dg, shul_dg, shvh_dg, shvl_dg, shwh_dg and shwl_dg by means of the SPI communication of the MCU 100, it is capable of confirming that the FET1 to FET6 are turned-OFF at the time of the short detection of the respective FETs FET1 to FET6. That is, in a case of the register shul_dg="1", a register sh_op is set to "001" or "010" (the FET driving is turned-OFF at the time of the short detection) with the SPI communication of the SPI communication circuit 112 and the register shul_dg is set to "1" with the SPI communication. The register scul is "1" (the short detecting state) at a state of the register shul_dg="1", and then the NDIAG becomes to "L". In the state of the NDIAG="L", when the duty signal LD4="H" is inputted from the MCU 100, it is possible to detect that the FET1 and the FET4 are turned-OFF by monitoring the connection point voltage of the upper stage FET1 and the lower stage FET4. The register shul_dg="0" and NDIAG="H" are obtained by setting again the register shul_dg="0", and the normal abnormality detecting function becomes available.

As well, the error logic circuit 111 performs a logic built-in self test (LBIST). In a case of the register shul_dg="0", when the unit is actually the short detecting state, the NDIAG becomes to "L". Similarly, the operation checks with reference to the another phases can be performed.

Figure 11:
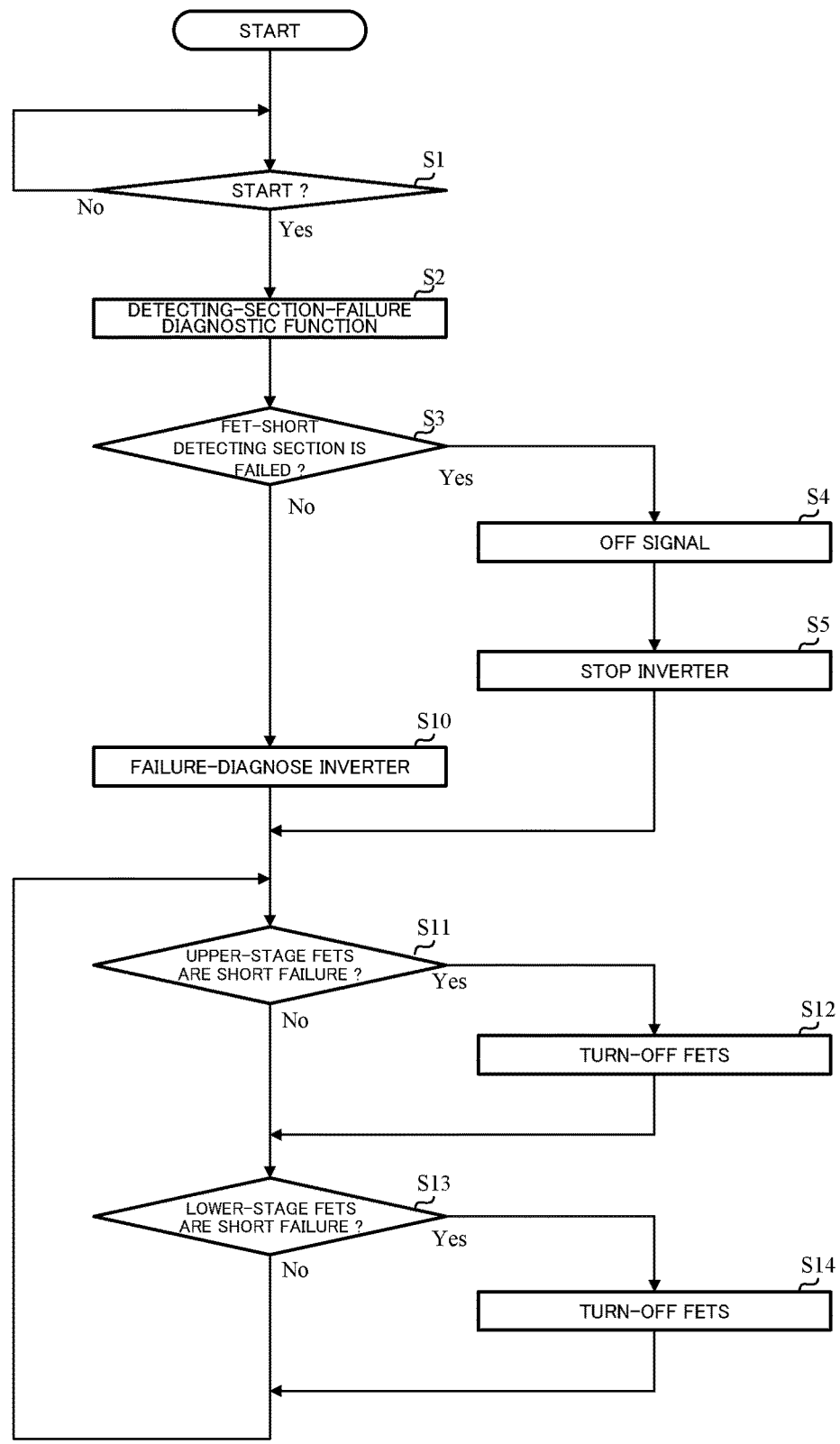
FIG. 11 is a flowchart showing an operation example (the first embodiment) of the present invention.

In such a configuration, the operation example (the first embodiment) will be described with reference to the flowchart of FIG. 11.

When the operation is started (Step S1), the detecting-section-failure diagnostic function in the MCU 100 is worked (Step S2), and diagnoses whether the FET-short detecting section 110 is failed or not (Step S3). When the failure of the FET-short detecting section 110 is diagnosed by the detecting-section-failure diagnostic function, the MCU 100 outputs the ALARM1 or the ALARM2, the alarm input circuit 104 outputs the gate-OFF command GF (Step S4), and the inverter 37 is stopped (Step S5) by inputting the gate-OFF command GF into the gate driving section 130.

In a case that the failure of the FET-short detecting section 110 is not detected at the above Step S3, the FET-short detecting section 110 diagnoses the short failure of the FETs of the inverter (Step S10). The FET-short detecting section 110 diagnoses the upper-stage FETs and the lower-stage FETs of the inverter 37 by comparing the status of the above Table 1, and at first judges whether the upper-stage FETs are failed or not (Step S11). In a case that the upper-stage FETs are failed, the lower-stage FETs are turned-OFF with the error notifications EN, and further the upper-stage FETs are also turned-OFF (Step S12). Next, it is judged whether the lower-stage FETs are failed or not (Step S13). In a case that the lower-stage FETs are failed, the upper-stage FETs are turned-OFF with the error notifications EN, and further the lower-stage FETs are also turned-OFF (Step S14).

As well, the order of detecting the short failure of the upper-stage FETs and the lower-stage FETs may be changeable.

The detection of the short failure of the lower-stage (L-side) FETs monitors the drain voltages SHU, SHV and SHW of the lower-stage FETs in a state that the upper-stage (H-side) FETs are turned-ON state (the lower-stage FETs are turned-OFF state), and it is judged that the short failure occurs if the drain voltages SHU, SHV and SHW are lower than the threshold HREF. Further, if the drain voltages SHU, SHV and SHW are equal to or higher than the threshold HREF, it is judged that the short failure does not occur. In a case that the short failure is detected, the error notifications EN are transmitted from the FET-short detecting section 110 to the gate driving section 150, and the inverter FETs are turned-OFF. Concretely, if the FETs are not failed in normal, in a case that the upper-stage FETs are turned-ON (=the lower-stage FETs are turned-OFF), the connection point voltages SHU, SHV and SHW are represented by a following Equation 3 as an ON-resistance of the upper-stage FETs is "$_{RON}$" and the current is "ION".

$$\text{connection point voltage=supplying voltage} \\ HS-RON \times ION \qquad \text{[Equation 3]}$$

If the lower-stage FETs are the short failure, the connection point voltages SHU, SHV and SHW are equivalent to 0 [V]. In the present embodiment, the H-side setting signal vthh_Sh and the L-side setting signal vthl_Sh are set to 1 [V]. In order to avoid an erroneous detection, the above values are set to a sufficiently larger value than "the ON-resistance $_{RON}$ of the upper-stage FETs×the current ION".

Further, the input signals HD1 to HD3 and LD4 to LD6 of the gate driving section 150 are the duty signals from the MCU 100 in order to drive the FETs (FET1 to FET6) of the inverter 37, and the gate driving section 150 drives the FET1 to the FET6 of the inverter 37 based on these duty signals HD1 to HD3 and LD4 to LD6, respectively. However, the inverter FETs are turned-ON or turned-OFF with a time delay for the inputs of the duty signals HD1 to HD3 and LD4 to LD6, due to a delay of an internal circuit and a capacitance of the inverter FETs. In order to prevent from the erroneous detection of the FET-short failure due to the above time delay, in a case that an input condition of the comparator 117 in the FET-short detecting section 110 only continues for 10 [ps], it is judged that the FET-short is detected.

Next, the operation that the MCU 100 detects the failure of the FET-short detecting section 110 will be described.

At start up, the detecting-section-failure diagnostic function in the MCU 100 diagnoses whether the FET-short detecting section 110 is failed or not. When the FET-short detecting section 110 is failed, the MCU 100 outputs the ALARM1 or the ALARM2 to the alarm input circuit 104, and the alarm input circuit 104 outputs the gate-OFF command GF to the gate driving section 150 and then turns-OFF the inverter FETs. Concretely, there is provided the resistor voltage-dividing circuit for diagnosis 120 to resistor-voltage-divide so that in a case that the outputs HD1g to LD6g of the gate driving section 150 are "OFF", the connection point voltage SHU between the upper-stage FET1 and the lower-stage FET4 of the inverter 37, the connection point voltage SHV between the upper-stage FET2 and the lower-stage FET5 and the connection point voltage SHW between the upper-stage FET3 and the lower-stage FET6 are almost 6 [V] being "the inverter power supply voltage (~the battery voltage 12 [V])×0.5". At start up, the MCU 100 outputs the gate-OFF command GF to forcibly turn-OFF the outputs HD1g to LD6g of the gate driving section 150, and the "H" signal is inputted into any one of the duty signals HD1 to HD3 and LD4 to LD6 being inputted into the gate driving section 150. Thereby, the abnormality condition of the above FET-short detection is forcibly established, and the MCU 100 diagnoses whether the failure detection by means of the FET-short detecting section 110 is no-detection state or not by monitoring that the logic output of the NDIAG is "L" (the logic output is "H" when the short failure is not detected).

Further, in a case that the FET-short detecting section 110 detects the FET-short failure, in order to confirm that the inverter FETs be able to turn-OFF, the MCU 100 outputs the signal (SPI) to forcibly transit the error notifications EN of the FET-short detecting section 110 to the FET-short detecting state, and the "H" signal is inputted into any one of the duty signals HD1 to HD3 and LD4 to LD6 being inputted into the gate driving section 150. Furthermore, the connection point voltages SHU, SHV and SHW of the upper-stage FETs and the lower-stage FETs of the inverter 37 are monitored. Thereby, the MCU 100 diagnoses that the inverter FETs are turned-OFF. If the inverter FETs are not turned-OFF, in a case that the duty signals HD1 to HD3 are "H", the connection point voltages SHU, SHV and SHW are equivalent to the power supply voltage of the inverter 37 (the voltage VR), and in a case that the duty signals LD4 to LD6 are "H", the connection point voltages SHU, SHV and SHW are equivalent to 0 [V] (grounded). Consequently, since the above voltages are not "the inverter power supply voltage× 0.5" in a case that the inverter FETs are turned-OFF, it is possible to detect that the inverter FETs are not turned-OFF.

In a case that the MCU 100 diagnoses that the FET-short is detected by the FET-short detecting section 110 and the inverter FETs are not turned-OFF at the time of the FET-short detection, the MCU 100 sets the duty signals HD1 to HD3 and LD4 to LD6 to the gate driving section 150 to "L" (="OFF") and maintains a safety state (an assist stop state) as the system.

It is possible to confirm that the FET-short detecting section 110 correctly works by using the detecting-section-failure diagnostic function, it is impossible to detect the occurrence of the no-detection failure of the FET-short detecting section 110 corresponding to the first failure by immediately turning-OFF the inverter FETs when the failure is detected, thereafter the short failure of the inverter FETs corresponding to the second failure occurs causing to the works of the inverter FETs, and it is possible to prevent that the overcurrent continuously flows in the FETs thereby to maintain the safety of the system. By using the FET-short detecting section 110 secured the safety as described above, it is possible to remove the expensive power supply relay or the switch which is disposed on the power supply line of the inverter for blocking the overcurrent which is generated in an occurrence time of the FET-short failure of the inverter.

Next, a timing operation example of the FET-short detection will be described with reference to timing charts of FIGS. 12A to 12J and FIGS. 13A to 13J.

Figure 12:
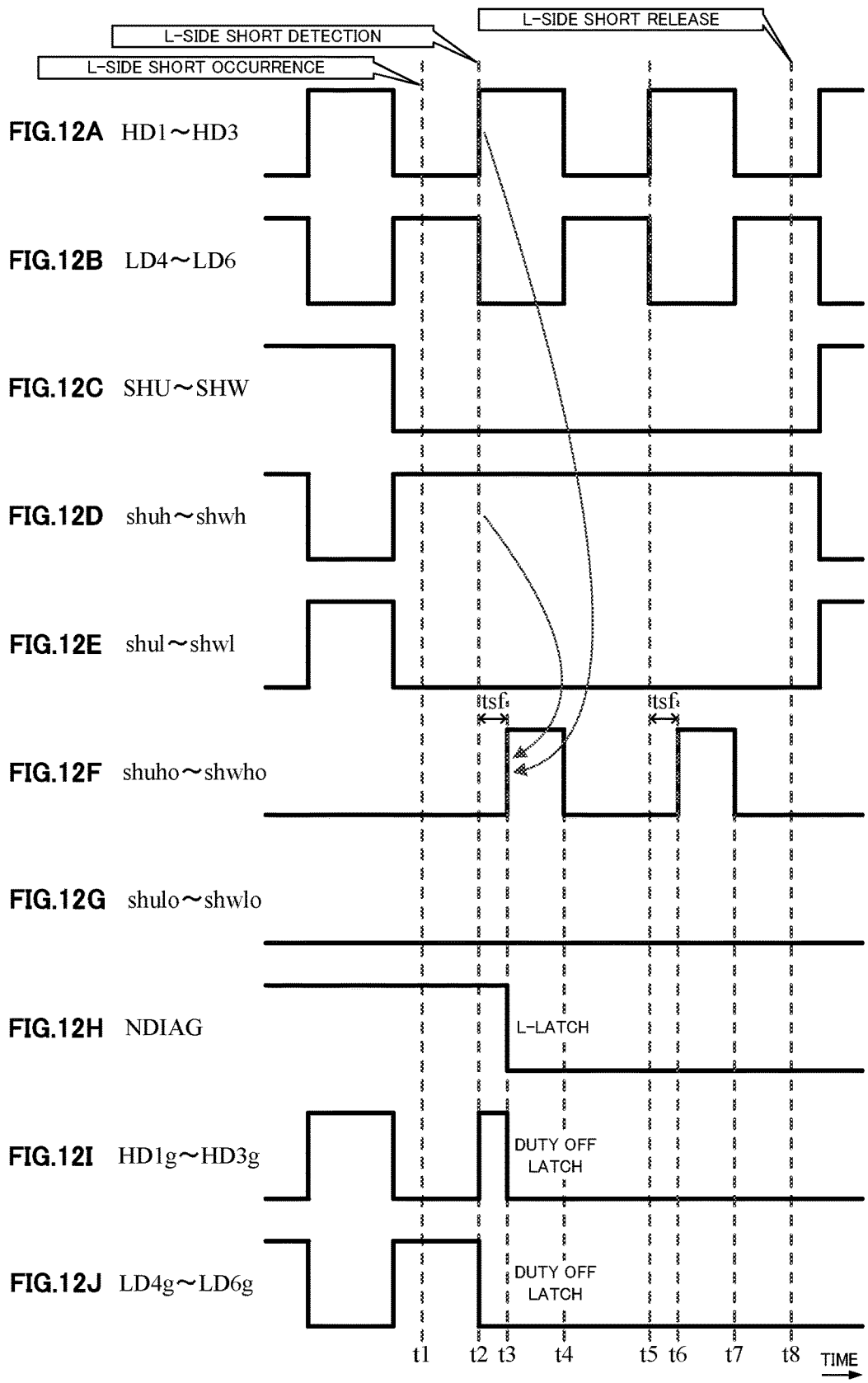
FIGS. 12A to 12J are timing flowcharts showing the operation example of the present invention.

FIGS. 12A to 12J show a state that the short failure at the lower-stage (L-side) FETs occurred at a time point t1, the short failure is detected at a time point t2 and the short failure is released at a time point t8. When the short failure is detected at the time point t2, the filter outputs shuho to shwho vary from "L" to "H", the NDIAG is latched to "L" and the duty signals HD1g to LD6g are latched to "OFF", as shown in FIGS. 12H to 12J.

Figure 13:
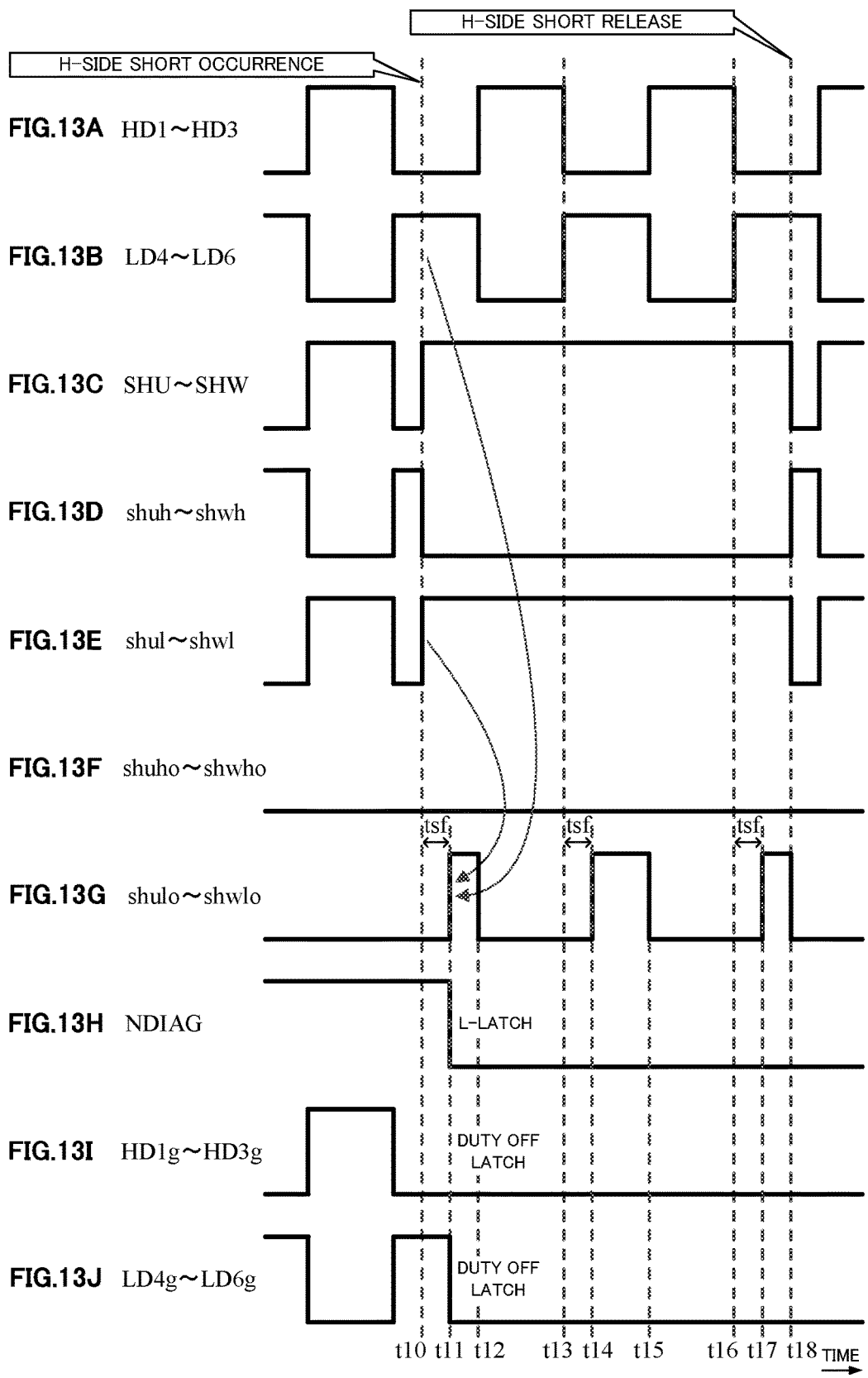
FIGS. 13A to 13J are timing flowcharts showing the operation example of the present invention.

FIGS. 13A to 13J show a state that the short failure at the upper-stage (H-side) FETs occurred and is detected at a time point t10 and the short failure is released at a time point t17. When the short failure is detected at the time point t10, the filter outputs shulo to shwlo vary from "L" to "H", the NDIAG is latched to "L" and the duty signals HD1g to LD6g are latched to "OFF", as shown in FIGS. 13H to 13J.

The dark current suppressing switch 130 made of the semiconductor switch (for example, the FET or the transistor) is provided between the power supply (the voltage VR) of the inverter 37 and the control section such as the MCU 100. The dark current suppressing switch 130 is switched-ON by the MCU 100 after the starting of the MCU 100 and is switched-OFF by the switching signal SW1 when the operation of the MCU 100 is stopped (the MCU 100 is de-energized). Thereby, the dark current, which flows from the power supply (the voltage VR) of the inverter to the control section while the operation of the ECU is stopped (the operation of the MCU is stopped), can be suppressed (the second embodiment).

Figure 14:
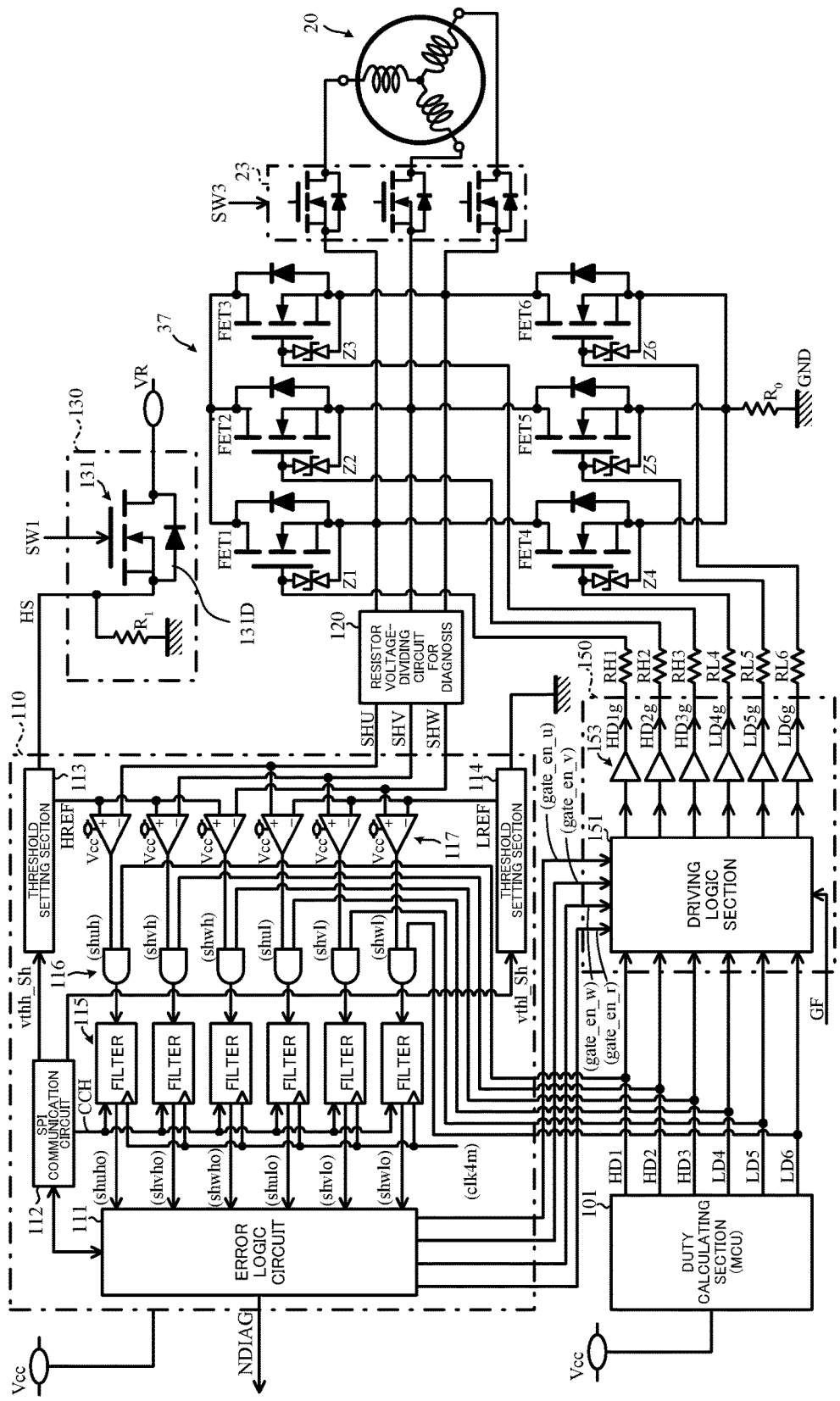
FIG. 14 is a block diagram showing the configuration example (the second embodiment) of the present invention.

FIG. 14 shows the second embodiment of the present invention corresponding to FIG. 7, the dark current suppressing switch 130 which comprises the FET 131 is interposed between the power supply VR and the control system, and the output voltage HS of the dark current suppressing switch 130 is supplied to the threshold setting section 113 and so on. A parasitic diode 131D having a function to block the dark current is in parallel connected to the FET 131 of the dark current suppressing switch 130. In the present embodiment, the FET is mentioned as an example. Alternatively, it is possible to use the semiconductor transistors such as general transistors.

Figure 15:
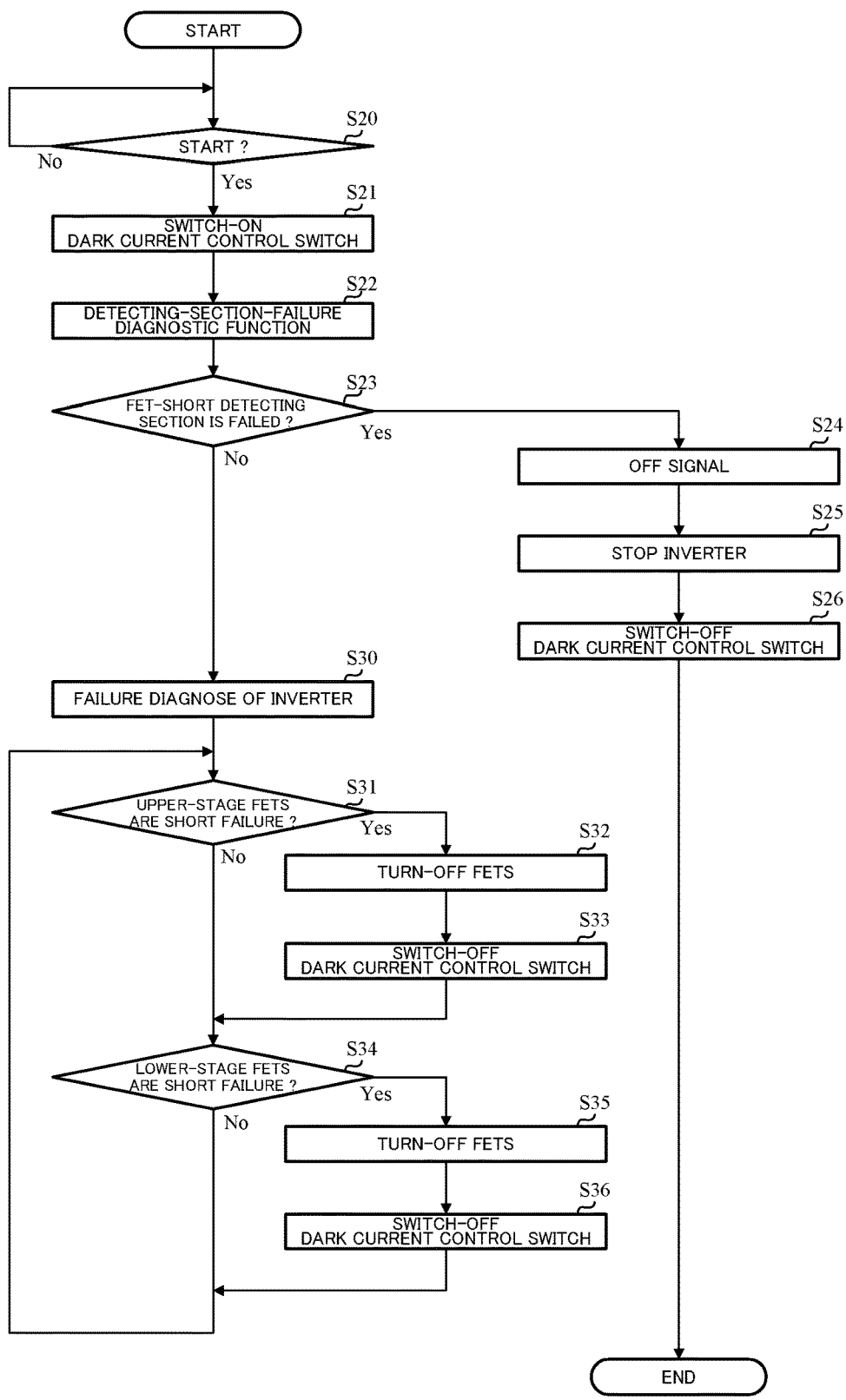
FIG. 15 is a flowchart showing the operation example (the second embodiment) of the present invention.

In such a configuration, the operation example (the second embodiment) will be described to the flowchart of FIG. 15.

When the operation is started (Step S20), the MCU 100 outputs the switching signal SW1, and the FET 131 of the dark current suppressing switch 130 is switched-ON (Step S21). Next, the detecting-section-failure diagnostic function in the MCU 100 works (Step S22), and diagnoses whether the FET-short detecting section 110 is failed or not (Step S23). When the failure of the FET-short is diagnosed by the detecting-section-failure diagnostic function, the MCU 100 outputs the ALRAM1 or the ALARM2, the alarm input circuit 104 outputs the gate-OFF command GF (Step S24), and the inverter 37 is stopped (Step S25) by inputting the gate-OFF command GF into the gate driving section 130. The switching signal SW1 is outputted and the FET 131 of the dark current suppressing switch 130 is switched-OFF (Step S26). Thereby, since the dark current, which flows from the power supply VR of the inverter 37 to the control system while the operation of the MCU is stopped, can be suppressed, a wasted battery consumption is suppressed.

In a case that the failure of the FET-short detecting section 110 is not detected at the above Step S23, the FET-short detecting section 110 diagnoses the short failure of the FETs of the inverter (Step S30). The FET-short detecting section 110 diagnoses the upper-stage FETs and the lower-stage FETs of the inverter 37 by comparing the status of the Table 1, and at first judges whether the upper-stage FETs are failed or not (Step S31). In a case that the upper-stage FETs are failed, the lower-stage FETs are turned-OFF by the error notifications EN, and further the upper-stage FETs perform the OFF-operation (Step S32). The FET 131 of the dark current suppressing switch 130 is switched-OFF with the switching signal SW1 (Step S33). Thereby, the dark current, which flows from the power supply VR of the inverter 37 to the control system while the operation of the MCU is stopped, can be suppressed.

Next, it is judged whether the lower-stage FETs are failed or not (Step S34). In a case that the lower-stage FETs are failed, the upper-stage FETs are turned-OFF by the error notifications EN, and further the lower-stage FETs perform the OFF-operation (Step S35). The FET 131 of the dark current suppressing switch 130 is switched-OFF with the switching signal SW1 (Step S36). Thereby, the dark current, which flows from the power supply VR of the inverter 37 to the control system while the operation of the MCU is stopped, can be suppressed.

In a case that neither the upper-stage FETs nor the lower-stage FETs are failed, the above operations are repeated. The order of detecting the short failure of the upper-stage FETs and the lower-stage FETs may be changeable.

Further, in the above-described first and second embodiments, the upper-stage FETs and the lower-stage FETs are latched OFF when detecting the FET short. It is not limited to the above example, and the operation, which the upper-stage FETs and the lower-stage FETs are turned-OFF only when the FET short is detected, may be applicable. Only the upper-stage FETs and the lower-stage FETs whose phase is the failure may be turned-OFF or the all inverter FETs may be turned-OFF.

In the above-described embodiments, the setting signals vthh_Sh and vthl_Sh are set to 1 [V]. It is not limited to the above example, and in order to avoid the erroneous detection, the value that is sufficiently larger than "the ON-resistance of the upper-stage FETs $_{RON}$×the current $_{ION}$" may be used. The determining time of the short detection is set to 10 [μs]. It is not limited to the above example, and the sufficiently long time, which the time delay of the gate driving section and the switching time of the inverter FETs are considered, may be used. Further, the above-described logic "H" and "L" may be switched.

In the above-described first and second embodiments, the dark current suppressing semiconductor switch is provided between the MCU and the power supply of the inverter (the voltage VR), that is, between the FET-short detecting section and the power supply of the inverter (the voltage VR). It is not limited to the above example, and the semiconductor switches may be connected between the power supply of the inverter (the voltage VR) and the control section, and be provided on the all paths which generate the dark current. In the above embodiments, although the MCU comprises the function which diagnoses whether the failure of the FET-short detecting section is occurred or not, the above function may be provided at the external of the MCU.

Furthermore, in the above-described embodiments, although the electronic control unit being applied to the electric power steering apparatus is described as an example, the electronic control unit can be applied to other apparatus which uses the inverter.

EXPLANATION OF REFERENCE NUMERALS 1 handle (steering wheel)
2 column shaft (steering shaft, handle shaft)
10 torque sensor
12 vehicle speed sensor
20 motor
23 motor release switch
30 control unit (ECU)
31 current command value calculating section
35 PI-control section
36 PWM-control section
37 inverter
100 micro controller unit (MCU)
101 duty calculating section
110 FET-short detecting section
111 error logic circuit
112 SPI communication circuit
113, 114 threshold setting section
117 comparator
120 resistor voltage-dividing circuit for diagnosis
130 dark current suppressing switch
140 resistor voltage-dividing circuit for power supply
150 gate driving section
151 driving logic section

The invention claimed is:

1. An electronic control unit that comprises a bridge having upper-stage field-effect transistors (FETs) and lower-stage FETs and driving-controls a three-phase blushless motor, via an inverter being supplied a power supply VR, by inputting a duty signal of a pulse width modulation (PWM) calculated in a micro controller unit (MCU) into a gate driving section, comprising:

a reverse connection protective FET which is interposed between a battery and said power supply VR and turns-ON/OFF with a switching signal from said MCU;

a diagnostic resistor voltage-dividing circuit which is supplied said power supply VR and outputs voltage-divided voltages obtained by voltage-dividing connection point voltages of said upper-stage FETs and said lower-stage FETs;

an FET-short detecting section which is supplied said power supply VR, and detects at least one-side short failure of said upper-stage FETs and said lower-stage FETs based on said voltage-divided voltages and outputs an error notification;

a dark current suppressing switch which is interposed between said power supply VR and said diagnostic resistor voltage-dividing circuit and said FET-short detecting section;

a resistor voltage-dividing circuit for power supply for level-shifting in accordance with an input range of said MCU in order to detect a voltage from said dark current suppressing switch; and a detecting-section-failure diagnostic function which inputs said error notification, is included in said MCU, and detects a failure of said FET-short detecting section, wherein said voltage from said dark current suppressing switch is supplied to said diagnostic resistor voltage-dividing circuit, said FET-short detecting section and said resistor voltage-dividing circuit for power supply, wherein said detecting-section-failure diagnostic function diagnoses said failure of said FET-short detecting section at start up and turns-OFF said upper-stage FETs and said lower-stage FETs when said failure of said FET-short detecting section is detected, and wherein said FET-short detecting section diagnoses said short failure of said upper-stage FETs and said lower-stage FETs when said failure of said FET-short detecting section is not detected.

2. The electronic control unit according to claim 1, wherein a Zener diode for absorbing an overvoltage is connected between a gate and a source for each of said upper-stage FETs and said lower-stage FETs.

3. The electronic control unit according to claim 1, wherein said dark current suppressing switch is transistor kind including an FET and a parasitic diode for reverse protection is connected in parallel.

4. The electronic control unit according to claim 2, wherein said dark current suppressing switch is transistor kind including an FET and a parasitic diode for reverse protection is connected in parallel.

5. The electronic control unit according to claim 1, wherein when said short failure is detected, at least FETs which one of said short failure is not detected are turned-OFF.

6. The electronic control unit according to claim 1, wherein when said short failure is detected, said upper-stage FETs and said lower-stage FETs are turned-OFF by inputting said error notification into said gate driving section.

7. The electronic control unit according to claim 1, wherein said FET-short detecting section notifies said error notification to said MCU via an NDIAG terminal when said short failure is detected, said MCU sends an error signal to an alarm input circuit, and said alarm input circuit turns-OFF said upper-stage FETs and said lower-stage FETs by inputting a gate-OFF command into said gate driving section.

8. The electronic control unit according to claim 7, wherein when a failure of said FET-short detecting section is detected, said detecting-section-failure diagnostic function outputs said gate-OFF command from said alarm input circuit or outputs said gate-OFF command by means of said duty signal.

9. The electronic control unit according to claim 7, wherein said detecting-section-failure diagnostic function is a diagnostic function that outputs a gate-OFF signal which forcibly turns-OFF said inverter from said MCU at start up, forcibly establishes an abnormality condition of said short failure by calculating with said duty signals of said upper-stage FETs or said duty signals of said lower-stage FETs, and outputs a predetermined signal to said NDIAG terminal.

10. The electronic control unit according to claim 7, wherein said detecting-section-failure diagnostic function has a diagnostic function that outputs a signal which forcibly transits said error notification from said MCU to an FET-short detecting state in order to confirm being capable of turning-OFF and stopping said inverter in a case that said FET-short detecting section detects said short failure, calculates with said duty signals of said upper-stage FETs or said duty signals of said lower-stage FETs, monitors said connection point voltages, and diagnoses that a stop of said inverter is completed.

11. An electric power steering apparatus that is equipped with the electronic control unit according to claim 1.

* * * * *